United States Patent
Hoshizaki et al.

(10) Patent No.: US 7,345,346 B2
(45) Date of Patent: Mar. 18, 2008

(54) FIELD EFFECT TRANSISTOR HAVING CONTACT PLUGS IN THE SOURCE REGION GREATER THAN IN THE DRAIN REGION

(75) Inventors: Hiroyuki Hoshizaki, Kanagawa (JP); Hiroshi Furuta, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/591,549

(22) Filed: Nov. 2, 2006

(65) Prior Publication Data

US 2007/0108535 A1    May 17, 2007

(30) Foreign Application Priority Data

Nov. 14, 2005  (JP) .............................. 2005-328326

(51) Int. Cl.
*H01L 29/76*  (2006.01)
*H01L 29/94*  (2006.01)
*H01L 31/062* (2006.01)
*H01L 31/113* (2006.01)
*H01L 31/119* (2006.01)

(52) U.S. Cl. ................ 257/368; 257/369; 257/E27.064

(58) Field of Classification Search ................ 257/204, 257/206, 334, 337–338, 368–369, E27.064
See application file for complete search history.

(56) References Cited

U.S. PATENT DOCUMENTS

| 2004/0031004 A1 | 2/2004 | Yoshioka |
| 2004/0104452 A1* | 6/2004 | Yamaguchi ................ 257/536 |
| 2004/0232554 A1 | 11/2004 | Hirano |

FOREIGN PATENT DOCUMENTS

| JP | 11-354807 | 12/1999 |
| JP | 2000-031487 A | 1/2000 |
| JP | 2004-072017 A | 3/2004 |
| JP | 2004-349537 A | 12/2004 |

* cited by examiner

*Primary Examiner*—Hoai v Pham
(74) *Attorney, Agent, or Firm*—Foley & Lardner LLP (57) ABSTRACT

A semiconductor device having a field effect transistor formed on a semiconductor layer on an insulator, comprising: a drain electrode wiring formed over a drain region of the field effect transistor; a source electrode wiring formed over a source region of the field effect transistor; first contact plugs connecting the drain region and the drain electrode wiring; and second contact plugs which connect the source region and the source electrode wiring, and the number of which is greater than the first contact plugs.

19 Claims, 7 Drawing Sheets

Fig. 8  ▪ : RECESS

FIELD EFFECT TRANSISTOR HAVING CONTACT PLUGS IN THE SOURCE REGION GREATER THAN IN THE DRAIN REGION

BACKGROUND OF THE INVENTION

1. Field of the Invention

The present invention relates to a semiconductor device, and more particularly, to a semiconductor device using a silicon-on-insulator (SOI) structure.

2. Description of Related Art

Semiconductor devices having an SOI structure have become popular accompanying the increased speeds and lower power consumption of semiconductor devices in recent years. In an SOI structure, an insulating layer is formed on a support substrate made of silicon and so forth, and a silicon layer is formed on the insulating layer. In an SOI structure, circuit elements such as transistors are formed on a silicon layer on an insulating layer. Semiconductor devices using an SOI structure have a structure in which the periphery of circuit elements is covered with an insulator. These insulators have lower thermal conductivity than the silicon serving as the support substrate. Consequently, semiconductor devices employing an SOI structure have difficulty in allowing heat generated by a transistor, for example, to escape to the outside, thereby resulting in self-heating. The operation of the transistor becomes unstable if the temperature of the semiconductor device rises due to this self-heating. Consequently, several countermeasures have been devised to deal with this.

Japanese Unexamined Patent Application Publication No. 11-354807 (Shimoida et al.) and Japanese Unexamined Patent Application Publication No. 2004-349537 (Hirano et al.) describe the formation of holes extending from a silicon layer to a support substrate through an insulating layer. In Shimoida et al. and Hirano et al., a material having high thermal conductivity is embedded within these holes. Japanese Unexamined Patent Application Publication No. 2004-72017 (Yoshioka) and Japanese Unexamined Patent Application Publication No. 2000-31487 (Hirasawa et al.) describe the formation of heat-dissipating wires and heat conducting portions extending to upper layer wiring. Yoshioka and Hirasawa et al. disclose technologies which use a conductive layer on a silicon layer to dissipate heat.

However, both Shimoida et al. and Hirano et al. require a process for providing holes in an insulator. Yoshioka and Hirasawa et al. limit the circuit wiring layout due to the presence of a wiring layer and so forth for dissipating heat. In addition, neither of the above technologies consider how heat is to be transferred from a heat generator in the form of a transistor to wiring layers and holes serving as heat dissipators. Consequently, heat dissipation effects become small in the case the thermal resistance from the transistor to the heat dissipator is large.

The following provides an explanation of the relationship between heat generation and heat dissipation of a semiconductor device, and the aforementioned thermal resistance.

When considering the typical relationship between heat absorption and heat generation, a relationship like that expressed by the following equation is valid when Q (W) is taken to represent calorific value, T (° C.) temperature difference, and θ thermal resistance (° C./W).

$$\theta = T/Q \tag{1}$$

In the case of considering a transistor to be a heat generator, the thermal resistance in the above equation is considered to consist of the thermal resistance θp resulting from a plug between a diffusion layer and a wiring layer, thermal resistance θh of the wiring, thermal resistance θe of an interlayer insulating layer (or package material), and thermal resistance θj of the transistor itself. Therefore, temperature difference T of the above equation is equivalent to the difference between temperature Tj of the diffusion layer and ambient temperature Te of the interlayer insulating layer (or package material). A relationship like that indicated below results when the calorific value Q of the transistor is substituted into the above equation (1).

$$Tj - Te = Q*(\theta j + \theta p + \theta h + \theta e) \tag{2}$$

In this equation (2), Tj and θj are values determined by the structure of the semiconductor device, while Te and θe are values determined by the ambient conditions, package material and package shape. θh is determined by the wiring width and shape, and Yoshioka and Hirasawa et al. disclose technologies for reducing this value of θh.

In other words, in the prior art described above, although θh is reduced to increase heat dissipation effects, there are no considerations whatsoever given to thermal resistance θp extending from a heat generator in the form of the transistor to the wiring. In the case in which this θp ends up becoming large, heat is unable to be propagated from the heat generator in the form of the transistor, thereby resulting in cases in which the aforementioned technologies are unable to adequately increase heat dissipation effects.

Shimoida et al. and Hirano et al. also do not give any consideration whatsoever to the resistance value from a heat generator in the form of a diffusion layer to holes, namely the thermal resistance corresponding to θp. Thus, Shimoida et al. and Hirano et al. required a separate process for forming holes in an insulating layer.

As has been described above, the prior art either required a separate process for providing holes for heat dissipation, or were subject to layout restrictions due to the presence of wiring for heat dissipation. In addition, considerations are not given to thermal resistance from a heat generator to a heat dissipator. Consequently, there were cases in which adequate heat dissipation effects were unable to be obtained.

SUMMARY OF THE INVENTION

A semiconductor device according to a first aspect of the present invention is a semiconductor device having a field effect transistor formed on a semiconductor layer on an insulator, comprising: a drain electrode wiring formed over a drain region of the field effect transistor; a source electrode wiring formed over a source region of the field effect transistor; first contact plugs connecting the drain region and the drain electrode wiring; and second contact plugs which connect the source region and the source electrode wiring, and the number of which is greater than the first contact plugs.

In addition, the semiconductor device according to an aspect of the present invention is a semiconductor device having a plurality of field effect transistors formed on a semiconductor layer on an insulator, comprising: a first drain electrode wiring formed over a drain region of a first transistor; a second drain electrode wiring formed over a drain region of a second transistor; a source region formed common to the first and second transistors; a source electrode wiring formed over the source region; first contact plugs connecting the drain region of the first transistor and the first drain electrode wiring; second contact plugs connecting the drain region of the second transistor and the second drain electrode wiring; and third contact plugs which connect the source region and the source electrode wiring, and the number of which is greater than the sum of the first contact plugs and the second contact plugs.

In the present invention, heat can be efficiently propagated from a heat generator in the form of a transistor to other sections. Consequently, heat dissipation effects can be improved.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Embodiment 1

Figure 1A:
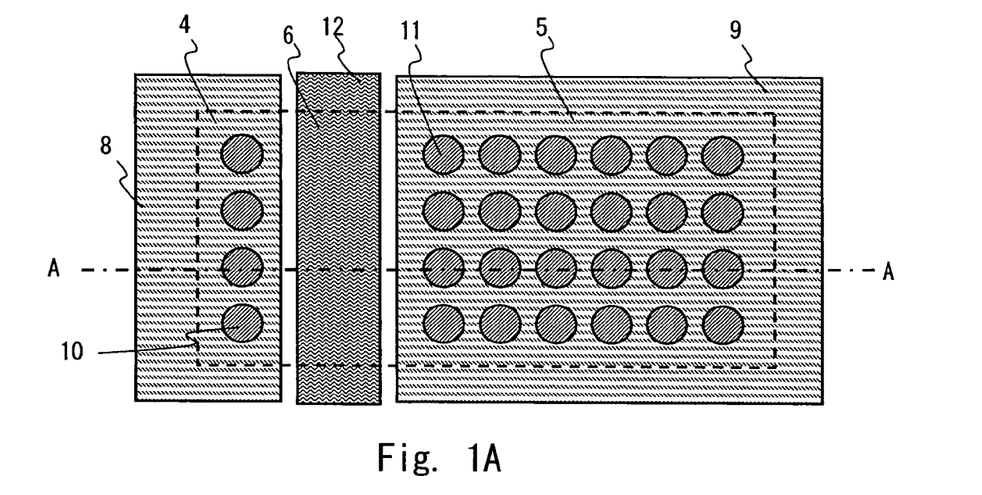
FIG. 1A and FIG. 1B are drawings showing a semiconductor device as claimed in a first embodiment of the present invention.
Figure 1B:
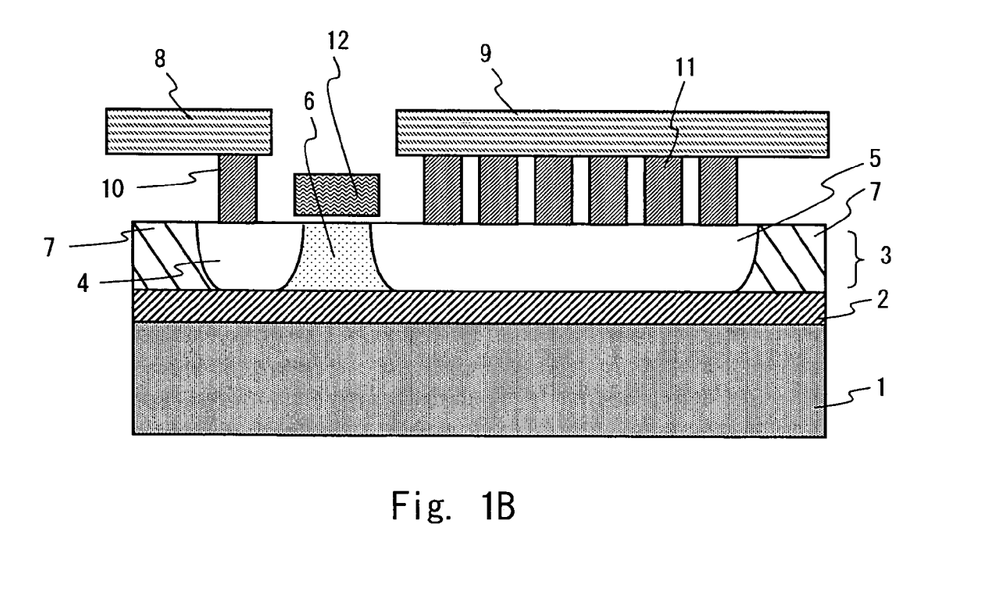

The following provides an explanation of a first embodiment of the present invention with reference to the drawings. FIGS. 1A and 1B are drawings showing the structure of a semiconductor device as claimed in a first embodiment of the present invention. FIG. 1A shows an overhead view of a field effect transistor section of the present embodiment, while FIG. 1B shows a cross-sectional view taken along A-A in FIG. 1A. As shown in FIG. 1B, a semiconductor device of the present embodiment has a support substrate 1, and insulating layer 2, and a silicon layer 3. Here, the support substrate 1 is composed of, for example, silicon. The insulating layer 2 is composed of a silicon oxide film, for example, formed on the support substrate 1. The silicon layer 3 is formed on the insulating layer 2. A circuit element of the semiconductor device in the form of a field effect transistor (to be simply referred to as a transistor) is formed on this silicon layer 3. In the present embodiment, this silicon layer 3 has a fully depleted SOI structure.

Impurities are diffused in a predetermined region of the silicon layer 3 to form a drain region 4 and a source region 5. Here, the silicon layer 3 interposed between the drain region 4 and source region 5 serves as a channel forming region 6. In FIG. 1A, this drain region 4, source region 5 and channel forming region 6 are shown surrounded by broken lines.

In addition, an oxide film 7 (for example, an $SiO_2$ film) for device isolation is formed around the outer periphery (outside the broken lines in FIG. 1A) of the drain region 4 and the source region 5. A drain electrode wiring 8 is formed on the drain region 4 on the substrate, and a source electrode wiring 9 is formed on the source region 5. The drain electrode wiring 8 and the drain region 4 are connected by drain contact plugs (to be simply referred to as drain plugs) 10. The source electrode wiring 9 and the source region 5 are connected by source contact plugs (to be simply referred to as source plugs) 11. In addition, a gate oxide film (not shown) and a gate electrode 12 are formed on the channel forming region 6. In addition, although not shown in the drawing, an interlayer insulating film and so forth is also formed on the substrate.

As shown in FIG. 1A, in the present embodiment, the number of source plugs 11 are formed to be sufficiently greater than the number of drain plugs 10. In addition, the source electrode wiring 9 is formed so as to cover the entire surface of the source region 5. The following provides an explanation of heat dissipation operation in the case of forming the number of source plugs 11 to be greater than the number of drain plugs 10 in this manner.

Since the contact plugs such as source plugs 11 are formed with a conductor, they have high thermal conductivity. Consequently, the heat generated by the transistor can be immediately transmitted to the wiring via the contact plug. Moreover, in a typical semiconductor device, the source of the transistor is connected to the power supply wiring or the ground wiring. In a semiconductor device, since the power supply and ground potentials are applied from wide wires, thick wires or a power supply mesh using wires in proximity to the uppermost layer, power supply wiring has the greatest heat dissipation effect. Consequently, by connecting the source electrode wiring 9 and the source region 5 using a number of source plugs 11 sufficiently greater than the number of drain plugs 10 as in the present embodiment, the heat generated by the transistor is transmitted to the power supply wiring and ground wiring via the source plugs 11 and the source electrode wiring 9. As a result, heat dissipating effects in the semiconductor device are improved, and operating errors caused by self-heating effects can be decreased.

In addition, in the case of increasing the number of contact plugs on the drain side, although heat propagates more easily from the drain side to the drain electrode wiring, drain capacitance also ends up increasing. An increase in drain capacitance may have an effect on circuit characteristics. Since there is no problem even if source capacitance increases if the wiring on the source side is connected to the power supply or ground wiring, dissipation of heat from the source side is more preferable if the transistor is formed within a single silicon layer 3. In addition, even in the case of high thermal resistance in the pathway extending from the source electrode wiring 9 to wiring of an upper layer such as the power supply wiring, by forming a large number of source plugs, heat from the transistor itself propagates to the 1st layer of source electrode wiring 9, and since heat is also dissipated from the 1st wiring layer, generation of heat by the transistor itself can be reduced.

In a semiconductor device of the prior art, heat dissipation effects were obtained by decreasing wiring thermal resistance θh. In contrast, in a semiconductor device of the present embodiment, heat dissipation effects can be further improved in addition to the effects of the prior art by decreasing thermal resistance θp attributable to the plugs.

In a semiconductor device having a fully depleted SOI structure as in the present embodiment, the silicon layer 3 in which the transistor is formed is surrounded by the insulating layer 2 beneath the silicon layer 3 and the device isolating region in the form of insulating film 7. In a semiconductor device not having an SOI structure, heat generated by the transistor is able to propagate through a silicon substrate. In contrast, a heat dissipation pathway which passes through the substrate section is not present in a semiconductor device having a fully depleted SOI structure. Consequently, heat dissipation effects become extremely large by reducing thermal resistance to the wiring as in the present embodiment. In the present embodiment, the number of source plugs are preferably formed to be twice or more the number of drain plugs in order to increase heat dissipation effects.

Embodiment 2

Figure 2A:
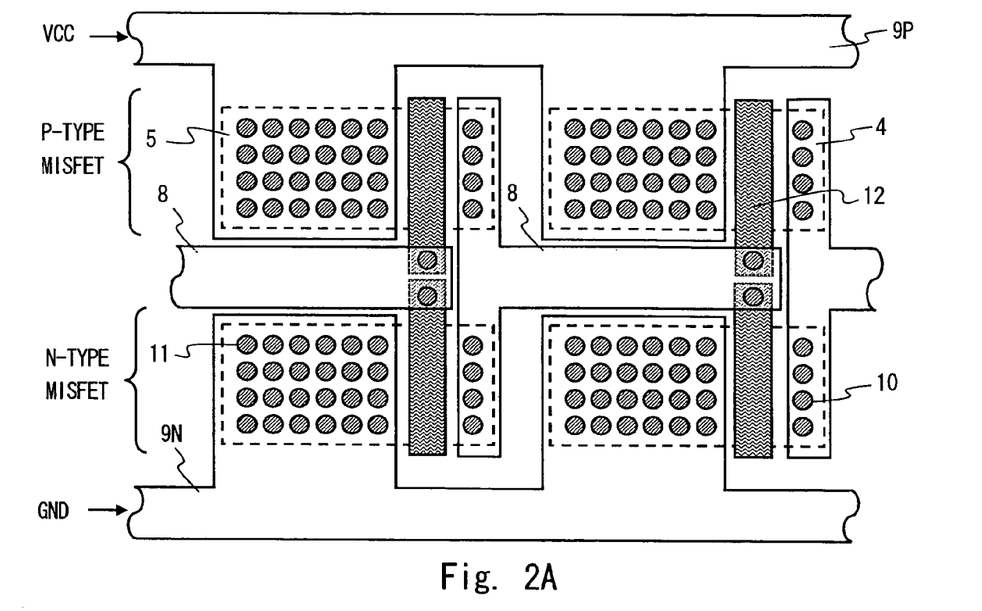
FIG. 2A and FIG. 2B are drawings showing a semiconductor device as claimed in a second embodiment of the present invention.
Figure 2B:
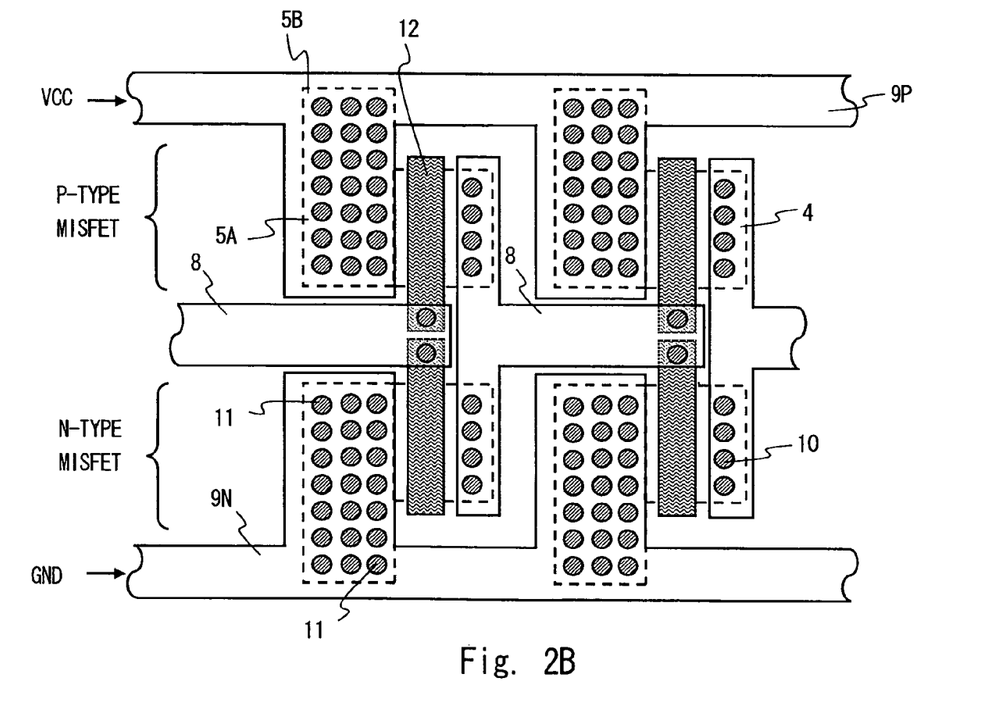

FIG. 2A is an overhead view showing the structure of a second embodiment of the present invention. Embodiment 2 is an example of composing an inverter using the transistor structure shown in Embodiment 1. FIG. 2A and FIG. 2B show a configuration in which the inverter is serially connected in two stages. In FIG. 2A and FIG. 2B, a P-type transistor is formed at the top of the drawings, while an N-type transistor is formed at the bottom of the drawings. In addition, in FIG. 2A and FIG. 2B, the same reference symbols are used for constituents for which an explanation thereof overlaps the explanation of Embodiment 1, and detailed explanations thereof are omitted.

As shown in FIG. 2A, in the inverter, a power supply potential VCC is supplied to the source of the P-type transistor. Consequently, the source electrode wiring 9P of the P-type transistor is connected in common. In addition, a ground potential is supplied to the source of the N-type transistor of the inverter. Consequently, the source electrode wiring 9N of the N-type transistor is connected in common. In the case of the inverter being connected in multiple stages, a T-shaped drain electrode wiring is connected between the drain of the P-type and N-type transistors and the gate electrode of the transistor of the next stage as shown with drain electrode wiring 8 in FIG. 2A. Heat dissipation effects are improved by making the number of source plugs of the inverter connected to the power supply wiring and ground greater than the number of drain plugs in this manner.

Furthermore, this type of configuration in which an inverter is connected in multiple stages in this manner is used for the oscillation circuit of a ring oscillator and so on. In semiconductor devices, oscillation circuits and the like are in constant operation, and generate an even greater amount of heat. Consequently, the application of the structure of the present embodiment to an oscillation circuit or other circuit section which is in constant operation makes it possible to increase heat dissipation effects of a semiconductor device.

FIG. 2B is an overhead view showing a variation of the present embodiment. In the transistor shown in FIG. 2A, the number of source plugs is increased by extending the source region 5 in the direction of a gate length L in order to increase the number of source plugs. However, the direction in which the source region 5 is extended is not required to be the direction of gate length L if the intent is to enable heat to propagate from the source region 5 to the source electrode wiring 9. Therefore, in this variation, the source region 5 is formed extending in the direction of a gate width W. In other words, the source region 5 of this variation has a gate adjacent section 5A adjacent to a gate electrode, and a source extending section 5B extended in the direction of gate width. Source plugs 11 are formed between the extending section and the source electrode wiring 9 extending in the direction of gate width. In the case the source electrode wiring 9 extends in the direction of gate width, the length of a semiconductor device in the direction of gate length can be decreased by forming the source plugs 11 in the extending section of the source region 5. Consequently, the overall size of the semiconductor device can be reduced.

Embodiment 3

Figure 3:
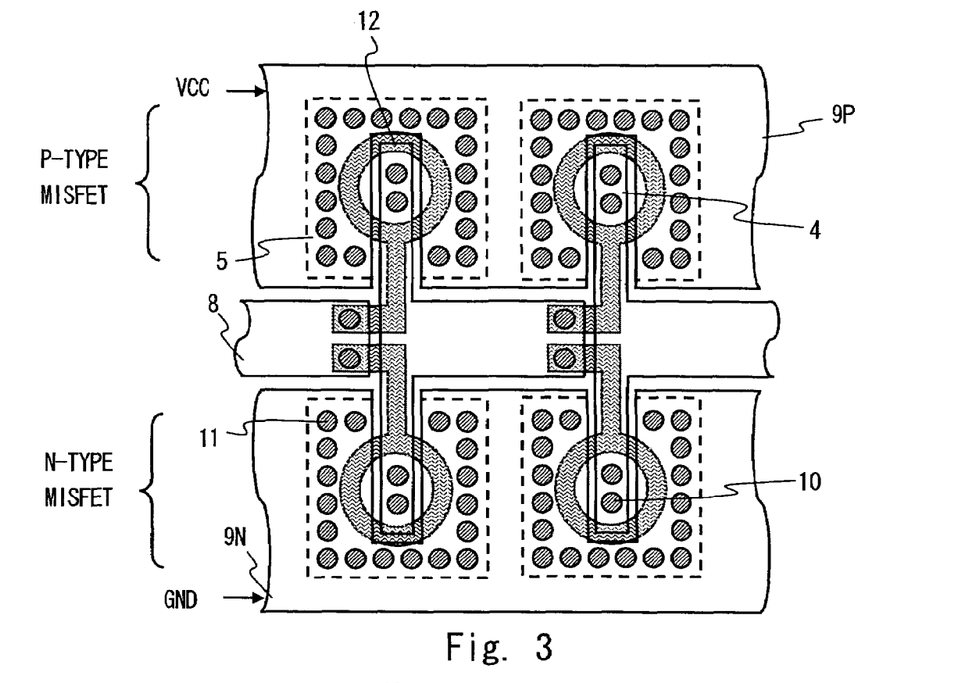
FIG. 3 is a drawing showing a semiconductor device as claimed in a third embodiment of the present invention.

FIG. 3 is an overhead view showing the configuration of a third embodiment of the present invention. In FIG. 3 as well, the same reference symbols are used for constituents which are in common with the explanations of Embodiments 1 and 2, and detailed explanations thereof are omitted.

FIG. 3 shows a configuration in a case in which an inverter is serially connected in two stages in the same manner as Embodiment 2. In Embodiment 3, the structure of each transistor is different from Embodiments 1 and 2. A transistor of Embodiment 3 has a gate electrode 12 formed in the shape of a ring. In addition, a channel forming region 6 (not shown) is also formed into the shape of a ring beneath the gate electrode 12. In the case of composing the gate electrode 12 in this manner, the drain region 4 is formed in an internal section having a ring shape, and the source region 5 is formed so as to surround this ring-shaped gate electrode 12 and drain region 4. As a result of employing this type of transistor, the number of the source plugs 11 can be made to be sufficiently greater than the number of drain plugs 10, and effects similar to Embodiments 1 and 2 can be obtained. In addition, by forming the gate into the shape of a ring, the number of source plugs can be made to be greater than the number of drain plugs more efficiently.

Embodiment 4

Figure 4:
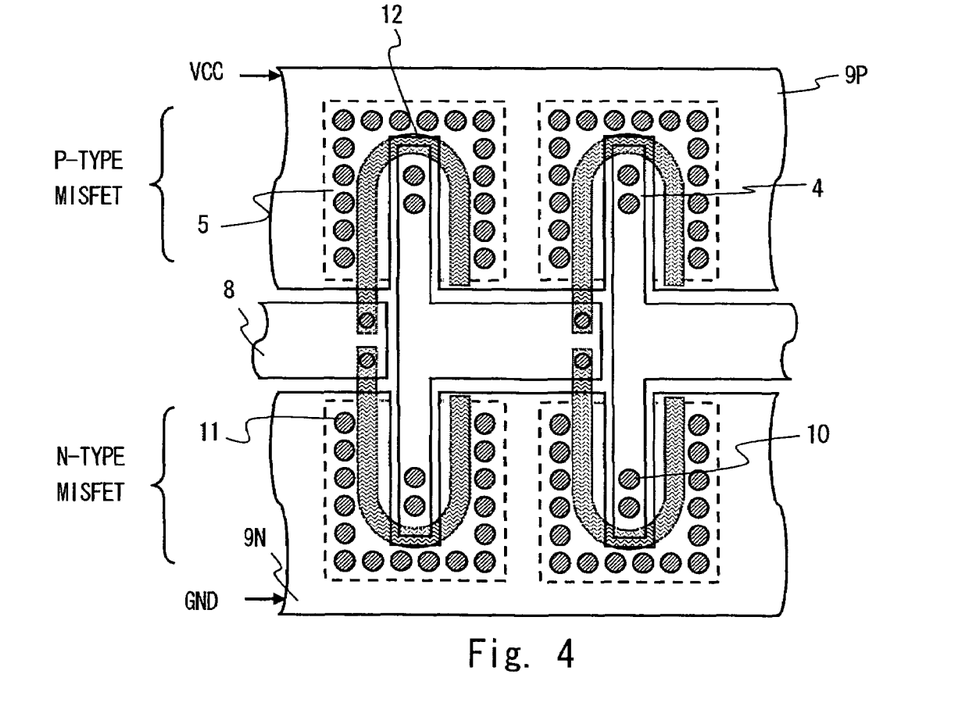
FIG. 4 is a drawing showing a semiconductor device as claimed in a fourth embodiment of the present invention.

FIG. 4 is an overhead view showing the configuration of a fourth embodiment of the present invention. In FIG. 4 as well, the same reference symbols are used for constituents which are in common with the explanations of the other embodiments, and detailed explanations thereof are omitted.

FIG. 4 shows a configuration in a case in which an inverter is serially connected in two stages in the same manner as Embodiments 2 and 3. In Embodiment 4, the structure of each transistor differs from the other embodiments. In a transistor of Embodiment 4, a gate electrode 12 is formed into a U-shape. In addition, a channel forming region 6 (not shown) is also composed in a U-shape beneath the gate electrode 12. In the case of composing the gate electrode 12 in this manner, the drain region 4 is formed in an internal section having a U-shape, and the source region 5 is formed so as to surround this U-shaped gate electrode 12. As a result of employing this type of transistor, the number of the source plugs 11 can be made to be sufficiently greater than the number of drain plugs 10, and effects similar to the other embodiments can be obtained.

Embodiment 5

Figure 5:
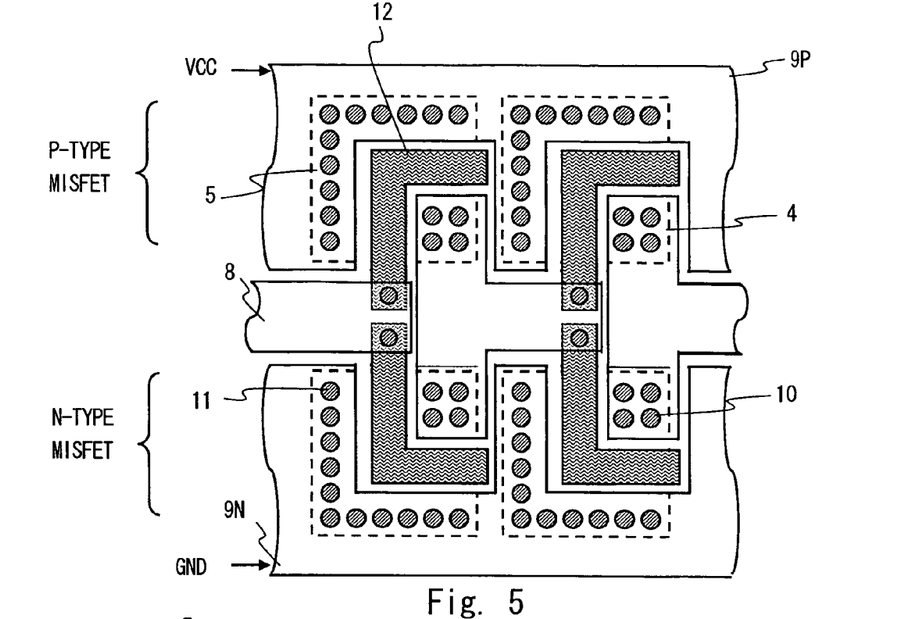
FIG. 5 is a drawing showing a semiconductor device as claimed in a fifth embodiment of the present invention.

FIG. 5 is an overhead view showing the configuration of a fifth embodiment of the present invention. In FIG. 5 as well, the same reference symbols are used for constituents which are in common with the explanations of the other embodiments, and detailed explanations thereof are omitted.

FIG. 5 shows a configuration in a case in which an inverter is serially connected in two stages in the same manner as Embodiments 2 to 4. In Embodiment 5, the structure of each transistor differs from the other embodiments. In a transistor of Embodiment 5, a gate electrode 12 is formed into an L-shape. In addition, a channel forming region 6 (not shown) is also composed in an L-shape beneath the gate electrode 12. In the case of composing the gate electrode 12 in this manner, the drain region 4 is formed in an internal section having an L-shape, and the source region 5 is formed to the outside of this L-shaped gate electrode 12. As a result of employing this type of transistor, the number of the source plugs 11 can be made to be sufficiently greater than the number of drain plugs 10, and effects similar to the other embodiments can be obtained.

Embodiment 6

Figure 6:
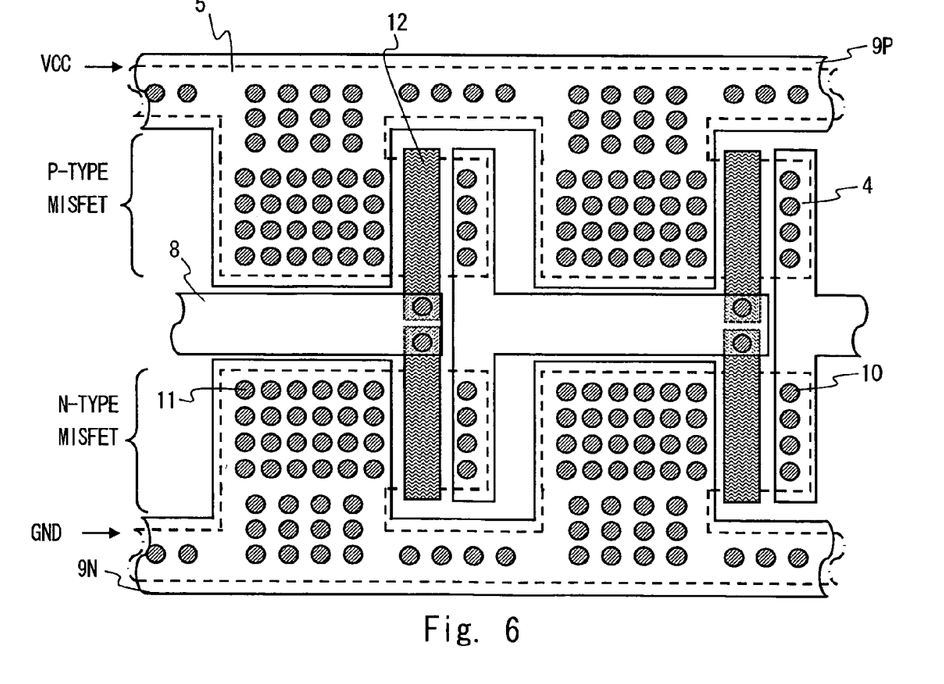
FIG. 6 is a drawing showing a semiconductor device as claimed in a sixth embodiment of the present invention.

FIG. 6 is an overhead view showing the configuration of a sixth embodiment of the present invention. In FIG. 6 as well, the same reference symbols are used for constituents which are in common with the explanations of the other embodiments, and detailed explanations thereof are omitted.

FIG. 6 shows a configuration in a case in which an inverter is serially connected in two stages in the same manner as Embodiments 2 to 5. In Embodiment 6, the source region 5 of each transistor differs from the other embodiments. In Embodiment 2, for example, the source region 5 of each transistor is defined, and a source region 5 is not formed over the entire region beneath the source electrode 9. However, when considering heat dissipation effects, providing as many contact plugs connecting the source region 5 and the source electrode 9 as possible results in greater effects. Consequently, in the present embodiment, the diffusion layer which forms the source region 5 is expanded within the range located beneath the source electrode 9 as much as is allowed by the design rule and so on. Consequently, in an instance in which inverters are connected in series, for example, the source regions of adjacent P-type transistors are formed as a single diffusion layer, and by also forming source plugs beneath the source electrode 9 connected in common to the source of the P-type transistors, large heat dissipation effects can be obtained. In addition, since the source electrode wiring which provides a power supply potential and ground potential is formed over a wide range on the semiconductor device, by expanding the source region 5 as to utilize the space beneath the source electrode wiring 9, heat from the silicon layer on the SOI substrate can be dissipated over a larger region.

Embodiment 7

Figure 7:
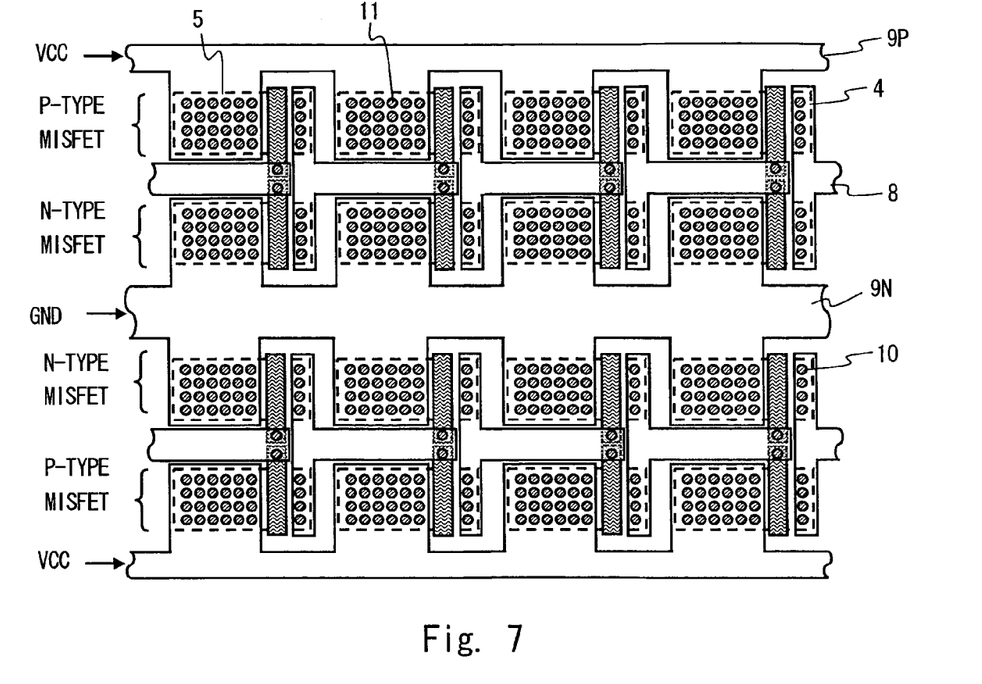
FIG. 7 is a drawing showing a semiconductor device as claimed in a seventh embodiment of the present invention.

FIG. 7 is an overhead view showing the configuration of a seventh embodiment of the present invention. In FIG. 7 as well, the same reference symbols are used for constituents which are in common with the explanations of the other embodiments, and detailed explanations thereof are omitted.

FIG. 7 shows a configuration in a case in which a plurality of functional devices such as an inverter as in Embodiment 2 are arranged in the form of an array. In a transistor having the structure shown in FIG. 2, for example, a plurality of inverters arranged in a row in the horizontal direction form a single circuit block. In the case of arranging two of these circuit blocks in the longitudinal direction, if an N-type transistor is arranged above and a P-type transistor is arranged below in circuit blocks mutually adjacent in the longitudinal direction, the source electrode of the N-type transistor can be shared with an adjacent block. FIG. 7 shows a schematic drawing of the case of arranging eight inverters in this manner. As shown in FIG. 7, in each row of the eight inverters, two N-type transistors are arranged to be mutually adjacent, and two P-type transistors are arranged so as to sandwich the those two inverters. The source electrodes 9 of the N-type transistors are formed to be wired in common roughly in the center of the drawing.

In general, wiring which supplies a power supply potential or ground potential is formed to be thicker than wiring for propagating signals. Consequently, by forming source electrode wiring equivalent to power supply and ground wiring in common between adjacent blocks in this manner, the wiring is able to demonstrate greater heat dissipation effects, thereby resulting in further improvement of heat dissipation effects.

Furthermore, in the case circuit blocks are continuously formed in the longitudinal direction of the drawing, blocks having the same configuration as FIG. 2 can be arranged downward in FIG. 7 so that the source electrode wiring of the P-type transistors is shared.

Embodiment 8

Figure 8:
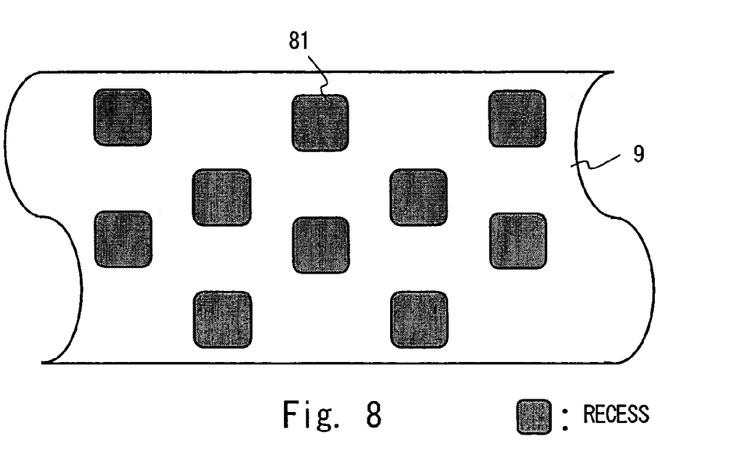
FIG. 8 is a drawing showing a semiconductor device as claimed in an eighth embodiment of the present invention.

FIG. 8 is an overhead view showing the configuration of an eighth embodiment of the present invention. Although the embodiments of Embodiments 1 to 7 were configured to reduce thermal resistance of the section extending from a transistor to wiring, in the present embodiment, a configuration is employed for increasing heat dissipation effects of the source electrode wiring itself.

As shown in FIG. 8, a source electrode wiring 9 of the present embodiment has a plurality of recesses 81 in the surface thereof. If a plurality of recesses, protrusions or cutout portions are formed in the surface of the source electrode wiring 9 in this manner, the surface area of the source electrode wiring 9 increases. If the surface area of the source electrode wiring 9 increase, the surface area of the section where heat is dissipated from the source electrode wiring 9 increases correspondingly, thereby resulting in greater heat dissipation effects.

In this manner, by increasing heat dissipation effects using source electrode wiring 9 as in the present embodiment, while also reducing thermal resistance to the source electrode wiring as in Embodiments 1 to 7, heat dissipation effects can be further improved.

Embodiment 9

Figure 9:
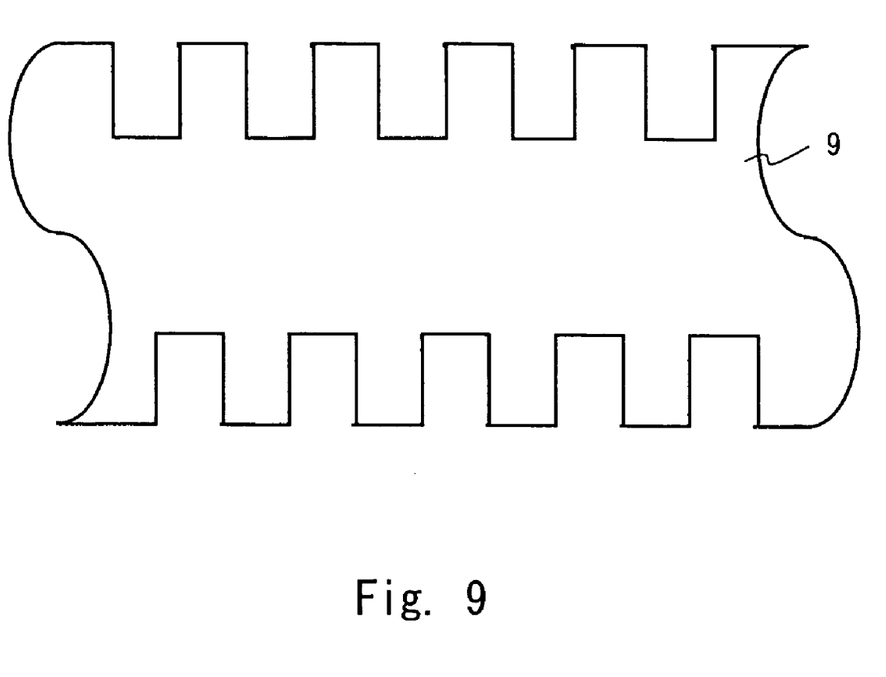
FIG. 9 is a drawing showing a semiconductor device as claimed in a ninth embodiment of the present invention; and, FIG. 10A and FIG. 10B are drawings showing the case of applying the present invention to a Fin field effect transistor.

FIG. 9 is an overhead view showing the configuration of a ninth embodiment of the present invention. Embodiment 9 is a variation of the case of improving wiring heat dissipation effects in Embodiment 8. Although Embodiment 8 shown in FIG. 8 increases wiring surface area by providing surface irregularities or cutout portions in the surface thereof, in Embodiment 9, since the shape itself (lateral surface) contains surface irregularities, the surface area of the wiring is increased. In FIG. 9, an example is shown in which the shape of the wiring is such that it has a plurality of rectangular notches. The use of a corrugated shape having surface irregularities for the shape of the wiring in this manner makes it possible to obtain even greater heat dissipation effects.

Variation

Figure 10A:
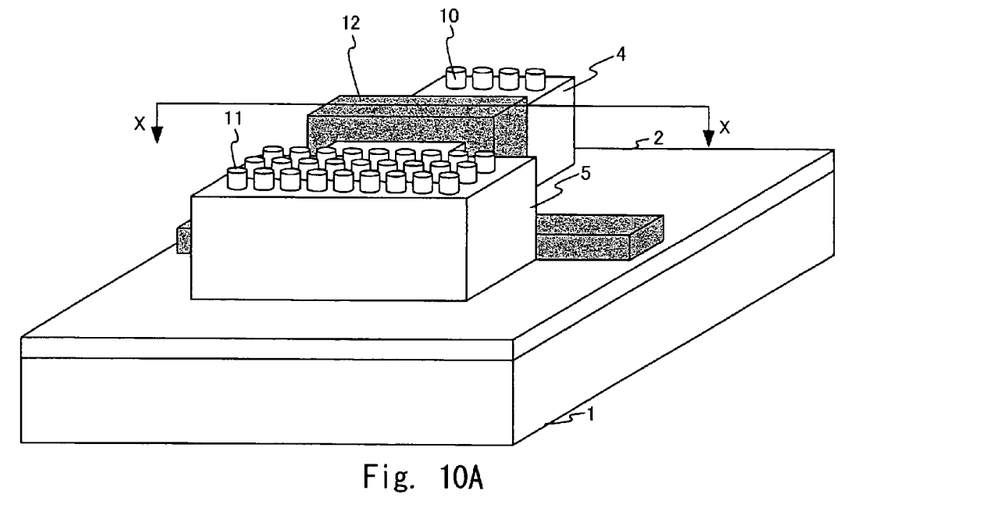
Figure 10B:
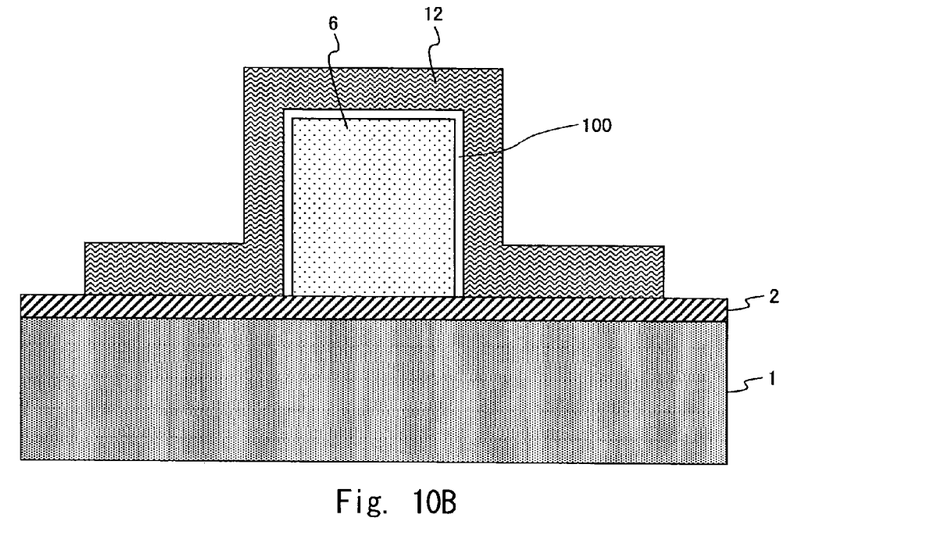

FIGS. 10A and 10B are schematic drawings showing a case of applying the present invention to a transistor referred to as a Fin field effect transistor. FIG. 10A shows a perspective view of a Fin field effect transistor, while FIG. 10B shows a cross-sectional view taken along line X-X in FIG. 10A.

A Fin field effect transistor refers to a transistor in which regions such as a source and drain are formed on an insulator, and those regions are connected with a silicon layer referred to as a fin. In a Fin transistor, a gate electrode is formed so as to cover the fin. In other words, Fin transistors have channels formed on a plurality of surfaces.

In FIGS. 10A and 10B, the same reference symbols are used for constituents which are in common with FIGS. 1A and 1B, and detailed explanations thereof are omitted.

Although the present invention has been explained based on the above-mentioned embodiments, the present invention can be altered in various ways without departing from the spirit and scope thereof. For example, the pitch between the source plugs can be set to be narrower than the pitch between the drain plugs to increase the number of source plugs. In addition, although the number of source plugs has been explained for efficiently propagating heat from the source region to the source electrode wiring, effects similar to those of the present invention can be demonstrated if, for example, the contact surface area of the source plugs is larger than that of the drain plugs. In this case, even if the numbers of source plugs and drain plugs are the same, effects similar to the present invention can be demonstrated if the contact surface area of each source plug is greater than the contact surface area of each drain plug.

Although the present invention can be applied to all field effect transistors comprising a semiconductor device, it is particularly preferably applied to circuit generating large amounts of heat during operation. Although an example of a ring oscillator was explained in the above-mentioned embodiments, the present invention can be applied to field effect transistors used in continuously operating circuits such as oscillating circuits and phase locked-loop circuits (PLL circuits). In addition, the present invention can also be partially applied to field effect transistors generating large amounts of heat in the form of output transistors and other transistors having high current levels.

In addition, each of the above-mentioned embodiments can be mutually combined. For example, a source region of a transistor having a ring-shaped gate can be expanded to beneath the source electrode wiring to increase the number of source plugs. In addition, although an explanation was provided of the case of forming a silicon layer on an oxide film in the form of an SOI structure, if a semiconductor device is formed by using the semiconductor layer on an insulator, the structure may be a silicon on nothing (SON) structure or structure using a glass substrate.

It is apparent that the present invention is not limited to the above-mentioned embodiments, and it may be modified and changed without departing from the scope and spirit of the invention.

What is claimed is:

1. A semiconductor device having a field effect transistor formed on a semiconductor layer on an insulator, comprising:

a drain electrode wiring formed over a drain region of the field effect transistor;
a source electrode wiring formed over a source region of the field effect transistor;
first contact plugs connecting the drain region and the drain electrode wiring; and
second contact plugs which connect the source region and the source electrode wiring, and the number of which is greater than the first contact plugs.

2. The semiconductor device according to claim 1, wherein the number of the second contact plugs are formed to be twice or more the number of the first contact plugs.

3. The semiconductor device according to claim 1, wherein the source electrode wiring is formed over substantially the entire surface of the source region.

4. The semiconductor device according to claim 1, wherein the source region is formed so as to surround the drain region.

5. The semiconductor device according to claim 4, wherein the field effect transistor further has a substantially ring-shaped gate electrode interposed between the source region and the drain region.

6. The semiconductor device according to claim 4, wherein the field effect transistor further has a substantially U-shaped gate electrode interposed between the source region and the drain region.

7. The semiconductor device according to claim 4, wherein the field effect transistor further has a substantially L-shaped gate electrode interposed between the source region and the drain region.

8. The semiconductor device according to claim 1, wherein the field effect transistor further has a gate electrode formed into a substantially rectangular shape,
the source region has a gate adjacent section adjacent to the gate electrode and an extending section extending in the direction of gate width of the gate electrode, and the second contact plugs are formed in the gate adjacent section and the extending section.

9. The semiconductor device according to claim 1, wherein the source electrode wiring is a source electrode wiring common to a plurality of circuit blocks.

10. The semiconductor device according to claim 9, wherein the source electrode wiring is interposed between the circuit blocks.

11. The semiconductor device according to claim 1, wherein a plurality of recesses, protrusions, cutout portions or notches are formed in the surface of the source electrode wiring.

12. The semiconductor device according to claim 1, wherein the source electrode wiring is connected to power supply wiring or ground wiring.

13. The semiconductor device according to claim 1, wherein the field effect transistor constitutes an oscillating circuit, PLL circuit or reference voltage generating circuit, analog-digital signal conversion circuit or digital-analog signal conversion circuit.

14. The semiconductor device according to claim 1, wherein a portion of the drain region and the source region of the field effect transistor are in contact with the insulator.

15. The semiconductor device according to claim 1, wherein the field effect transistor is a Fin field effect transistor.

16. A semiconductor device having a plurality of field effect transistors formed on a semiconductor layer on an insulator, comprising:

a first drain electrode wiring formed over a drain region of a first transistor;

a second drain electrode wiring formed over a drain region of a second transistor;
a source region formed common to the first and second transistors;
a source electrode wiring formed over the source region;
first contact plugs connecting the drain region of the first transistor and the first drain electrode wiring;
second contact plugs connecting the drain region of the second transistor and the second drain electrode wiring; and
third contact plugs which connect the source region and the source electrode wiring, and the number of which is greater than the sum of the first contact plugs and the second contact plugs.

17. The semiconductor device according to claim 16, wherein the source region is also formed common to a source region of another transistor differing from the first and second transistors.

18. The semiconductor device according to claim 16, wherein the source electrode wiring is connected to power supply wiring or ground wiring.

19. The semiconductor device according to claim 16, wherein the field effect transistor constitutes an oscillating circuit, PLL circuit or reference voltage generating circuit, analog-digital signal conversion circuit or digital-analog signal conversion circuit.

* * * * *